(12) United States Patent  
Lee et al.

(10) Patent No.: US 8,586,466 B2  
(45) Date of Patent: Nov. 19, 2013

(54) ELECTRICAL FUSE WITH A CURRENT SHUNT

(75) Inventors: Tom C. Lee, Essex Junction, VT (US); Thomas L. McDevitt, Underhill, VT (US); William J. Murphy, North Ferrisburgh, VT (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 12/967,308

(22) Filed: Dec. 14, 2010

(65) Prior Publication Data

US 2012/0146179 A1   Jun. 14, 2012

(51) Int. Cl.  
*H01L 21/44* (2006.01)

(52) U.S. Cl.  
USPC ............. 438/601; 257/E23.149; 257/E21.592

(58) Field of Classification Search  
USPC .................................. 438/601; 257/E23.149  
See application file for complete search history.

(56) References Cited

U.S. PATENT DOCUMENTS

| 2002/0011645 | A1 | 1/2002 | Bertin et al. |
| 2008/0057722 | A1 | 3/2008 | Nagao |
| 2009/0090994 | A1* | 4/2009 | Kim et al. ..................... 257/529 |
| 2009/0108396 | A1* | 4/2009 | Chidambarrao et al. ..... 257/529 |
| 2009/0109582 | A1* | 4/2009 | Jack et al. ....................... 361/56 |

\* cited by examiner

*Primary Examiner* — Daniel Luke  
(74) *Attorney, Agent, or Firm* — Wood, Herron & Evans LLP; Richard M. Kotulak

(57) ABSTRACT

Electrical fuses and methods for forming an electrical fuse. The electrical fuse includes a current shunt formed by patterning a first layer comprised of a first conductive material and disposed on a top surface of a dielectric layer. A layer stack is formed on the current shunt and the top surface of the dielectric layer surrounding the current shunt. The layer stack includes a second layer comprised of a second conductive material and a third layer comprised of a third conductive material. The layer stack may be patterned to define a fuse link as a first portion of the layer stack directly contacting the top surface of the dielectric layer and a terminal as a second portion separated from the top surface of the dielectric layer by the current shunt.

11 Claims, 5 Drawing Sheets

US 8,586,466 B2

ELECTRICAL FUSE WITH A CURRENT SHUNT

BACKGROUND

The invention relates generally to semiconductor fabrication and, in particular, to methods of fabricating an electrical fuse and device structures for an electrical fuse.

Programmable devices, such as electrical fuses (efuses) and antifuses, are fundamental elements that are widely being used in various programmable integrated circuits such as redundancy circuits of dynamic random access memories and static random access memories, programmable logic devices (PLDs), I/O circuits, chip identification circuits, etc. Electrical fuses may also constitute an element of a built-in self-repair system for a chip that constantly monitors a chip's functionality. If needed, the self-repair system can automatically activate one or more electrical fuses to respond to changing conditions.

The electrical fuse is electrically connected to one or more circuits and is initially closed at the time of fabrication. Conventional electrical fuses include two large plates defining an anode and a cathode, as well as a long, narrow fuse link connecting the anode and cathode. Electrical fuses may be dynamically programmed in real time by passing an electrical current of relatively high density through the fuse link. Large programming currents may cause the fuse link to rupture by an abrupt temperature increase and permanently open. Alternatively, smaller programming currents may cause a controlled electromigration of the fuse link material. Both programming modes elevate the resistance of the programmed electrical fuse in comparison with intact electrical fuses.

Although existing electrical fuses have proven adequate for their intended purpose, there exists a need for an improved structure for an electrical fuse and improved methods of manufacturing electrical fuses.

BRIEF SUMMARY

In an embodiment, a method is provided for forming an electrical fuse. The method includes depositing a first layer comprised of a first conductive material on a top surface of a dielectric layer and patterning the first conductive layer to define a current shunt. The method further includes depositing a layer stack on the current shunt and the top surface of the dielectric layer surrounding the current shunt. The layer stack includes a second layer comprised of a second conductive material and a third layer comprised of a third conductive material. The layer stack is patterned to define a fuse link as a first portion of the layer stack directly contacting the top surface of the dielectric layer and a terminal as a second portion separated from the top surface of the dielectric layer by the current shunt.

In another embodiment, an electrical fuse has a fuse link and a terminal each including a first layer comprised of a first conductive material and a second layer comprised of a second conductive material. The fuse link has a directly contacting relationship with a top surface of a dielectric layer. The electrical fuse further includes a current shunt comprised of a third conductive material. The current shunt is disposed between the terminal and the top surface of the dielectric layer.

In another embodiment, an electrical fuse has a fuse link including a first conductive layer and a current shunt disposed between the fuse link and a top surface of a dielectric layer. The first conductive layer is comprised of aluminum or copper. The current shunt includes a second conductive layer comprised of tungsten.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
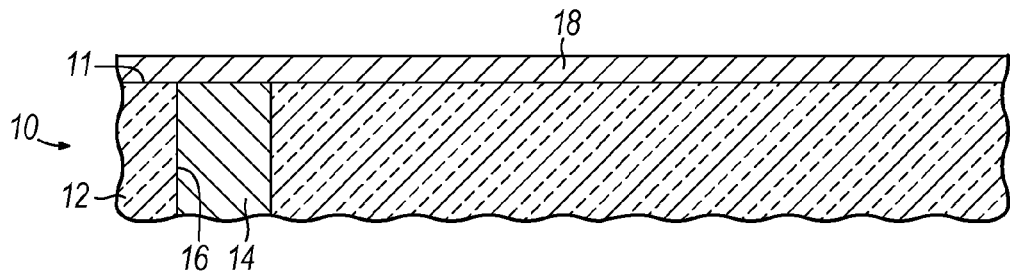
FIG. 1 is a cross-sectional view of a portion of a substrate taken at an initial fabrication stage of a processing method for an electrical fuse in accordance with an embodiment of the invention.

With reference to FIG. 1 and in accordance with an embodiment of the invention, an interconnect level 10 of an interconnect structure for an integrated circuit (not shown) includes a dielectric layer 12 and multiple contacts, such as the representative contact 14, that are electrically connected with the device structures of the integrated circuit. The representative contact 14 is located in a via 16 that penetrates through the dielectric layer 12. The dielectric layer 12 may be comprised of an electrically-insulating dielectric material, such as borophosphosilicate glass (BPSG), phosphosilicate glass (PSG), or an oxide of silicon like silicon dioxide ($SiO_2$), that has been deposited and planarized. The contact 14 may be comprised of a conductor, such as a refractory metal like tungsten (W) deposited in a conventional manner. The via 16 can be lined with a conductor, such as titanium nitride (TiN), that functions as a diffusion barrier and is also deposited in a conventional manner.

A layer 18 of an electrical conductor characterized by a relatively high melting point and a relatively low resistivity is deposited on a top surface 11 of the dielectric layer 12. In one embodiment, the layer 18 may be comprised of a metal, such as tungsten (W) deposited using a physical vapor deposition (PVD) process or a chemical vapor deposition (CVD) process using a precursor like tungsten hexaflouride ($WF_6$). Tungsten metal has a relatively high thermal and chemical stability, as well as low resistivity (5.6 $\mu\Omega\cdot cm$), comparatively low electromigration susceptibility, and a melting point of 3422° C. Layer 18 may have a physical layer thickness in a range of 10 nm to 50 nm.

Figure 2:
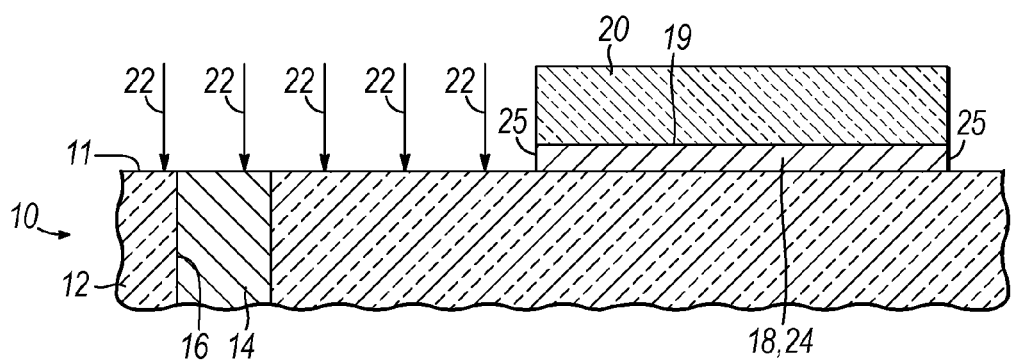
FIGS. 2-4 are cross-sectional views of the substrate portion of FIG. 1 at subsequent fabrication stages of the processing method.

With reference to FIG. 2 in which like reference numerals refer to like features in FIG. 1 and at a subsequent fabrication stage, a resist layer 20 comprised of a radiation-sensitive organic material is applied as a thin film to a top surface 19 of conductive layer 18 by spin coating. The resist layer 20 is pre-baked, exposed to radiation to impart a latent image of a pattern for etching the conductive layer 18, baked, and then developed with a chemical developer. The chemical developer removes nonpolymerized material to transform the latent image in the resist layer 20 into a final image pattern. In particular, residual portions of the resist layer 20 define a mask that covers a surface area of the conductive layer 18 at an intended location for an electrical fuse. Procedures for applying and lithographically patterning the resist layer 20 using a photomask and lithography tool are known to a person having ordinary skill in the art.

A dry etching process 22, such as reactive ion etching (RIE), is used to anisotropically remove regions of the conductive layer 18 from surface areas of dielectric layer 12 unmasked by resist layer 20. Following etching, a current shunt 24 remains as a residual region of the conductive layer 18 and is located in proximity to the contact 14. The current shunt 24 is bound by an outer perimeter 25 and the top surface 11 of the dielectric layer 12 is exposed outside of the outer perimeter 25. The chemistry of the dry etching process may be selected to stop on the dielectric material of dielectric layer 12. The resist layer 20 is subsequently removed by oxygen plasma ashing or chemical stripping.

Figure 3:
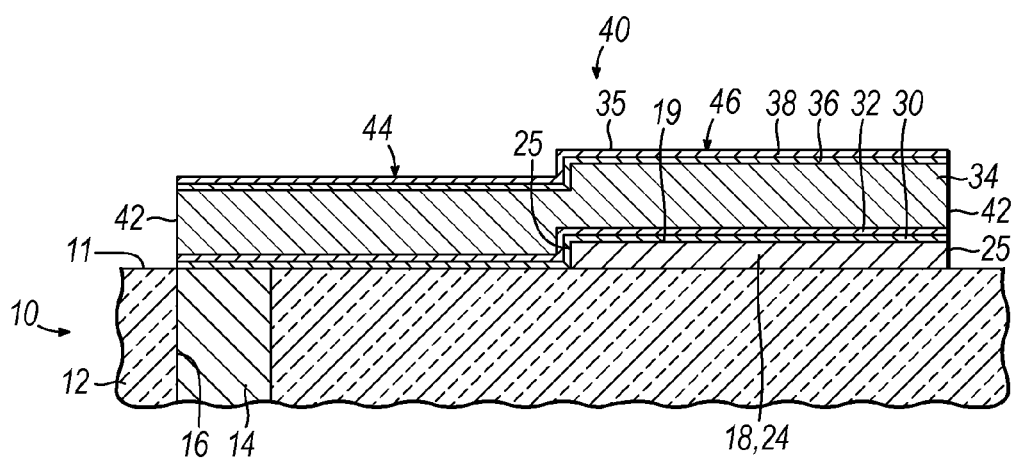
Figure 3A:
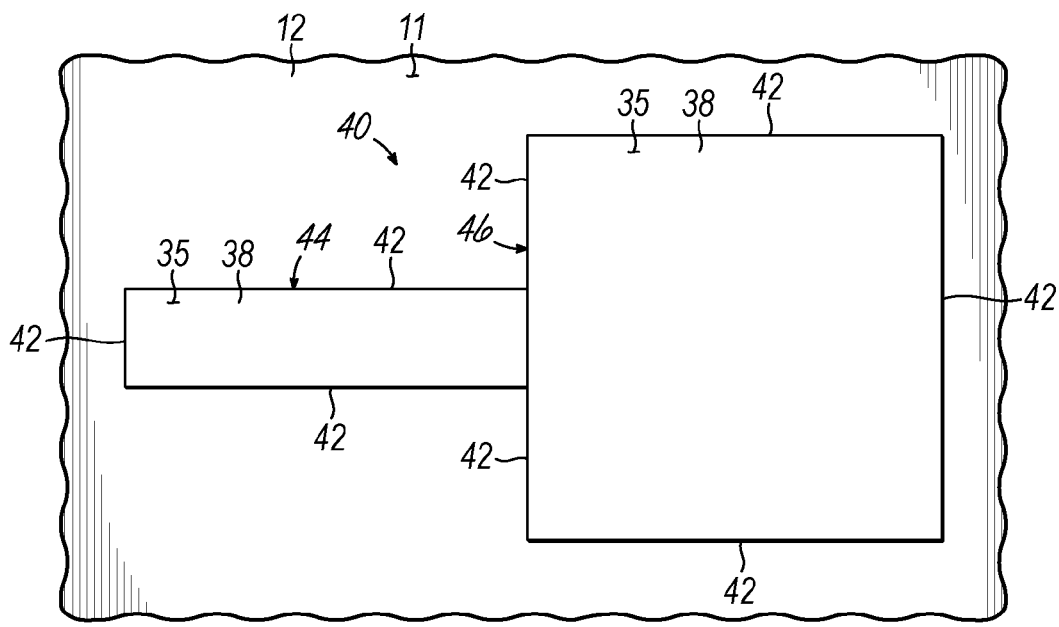
FIG. 3A is a top view of the substrate portion of FIG. 3.

With reference to FIGS. 3, 3A in which like reference numerals refer to like features in FIG. 2 and at a subsequent fabrication stage, a layer stack of conductive materials is deposited on the top surface 11 of dielectric layer 12 and on the current shunt 24 to form a thicker layer stack with the residual portion of layer 18. The layer stack includes a bottom bilayer consisting of cladding layer 30 and cladding layer 32, as well as a thicker layer 34 directly on a top surface of cladding layer 32. The layer stack further includes a top bilayer including layers 36, 38 deposited on a top surface of layer 34.

In alternative embodiments, one or both of the cladding layers 30, 32 and/or one or both of the cladding layers 36, 38 may be omitted from the fuse construction. In another alternative embodiment, both of the cladding layers 36, 38 may be omitted from the fuse construction while retaining one or both of cladding layers 30, 32.

The cladding layers 30, 32 and cladding layers 36, 38 are comprised of different conductive metals, such as titanium (Ti), tantalum (Ta), titanium nitride (TiN), tantalum nitride (TaN), ternary materials like titanium silicon nitride (TiSiN) and tantalum silicon nitride (TaSiN), which may be deposited by PVD processes such as direct current (DC) sputtering or radio frequency (RF) sputtering. In one embodiment, cladding layers 30, 36 are comprised of Ti and cladding layers 32, 38 are comprised of TiN so that the conductor of layer 34 is clad with TiN. Layer 34 may be comprised of a conductor such as copper (Cu), aluminum (Al), alloys (e.g., $Al_xCu_y$) of primary metals, and other similar metals. The materials in layers 30, 32, 34, 36, 38 have a lower melting point than the material in the layer 18 used to form the current shunt 24 and, in particular, the material in layer 34 is significantly more susceptible to electromigration than the material in the layer 18 used to form the current shunt 24.

A patterned mask, such as a patterned resist layer (not shown), is formed on a top surface 35 of layer 38 and covers surface area of the layer stack consisting of layers 30, 32, 34, 36, 38, including a portion of the layer stack superjacent the current shunt 24, at the intended location for an electrical fuse 40 (e.g., an efuse). The masked region is larger in surface area than the area of the current shunt 24. The layer stack is removed from the surface area of the top surface 11 of dielectric layer 12 that is not covered by the mask by RIE.

A fuse element or fuse link 44 and one terminal in the representative form of an anode 46 are defined from the layer stack as conjoined first and second portions with an outer perimeter 42 surrounded on all sides by the top surface 11 of dielectric layer 12. The fuse link 44 of the electronic fuse 40 is defined by a first portion of the layer stack that lacks the subjacent current shunt 24. The anode 46 of the electrical fuse 40 is a second portion of the layer stack that is underlaid by the current shunt 24. In one embodiment, the anode 46 is a plate with a larger surface area than fuse link 44. In the representative embodiment, the fuse link 44 is a narrow strip of conductive material having a narrower cross-sectional area and a smaller surface area (e.g., length and width) than the anode 46. In comparison to the fuse link 44, the thickness of the anode 46 is increased by the presence of the current shunt 24 beneath the second portion of the layer stack. The fuse link 44 and anode 46 are continuous portions of the layer stack in physical and electrical continuity. The contact 14 defines a second terminal, such as a cathode, of the electrical fuse 40 and electrically connects the layer stack in the fuse link 44 with underlying circuitry in the integrated circuit on the chip.

Figure 4:
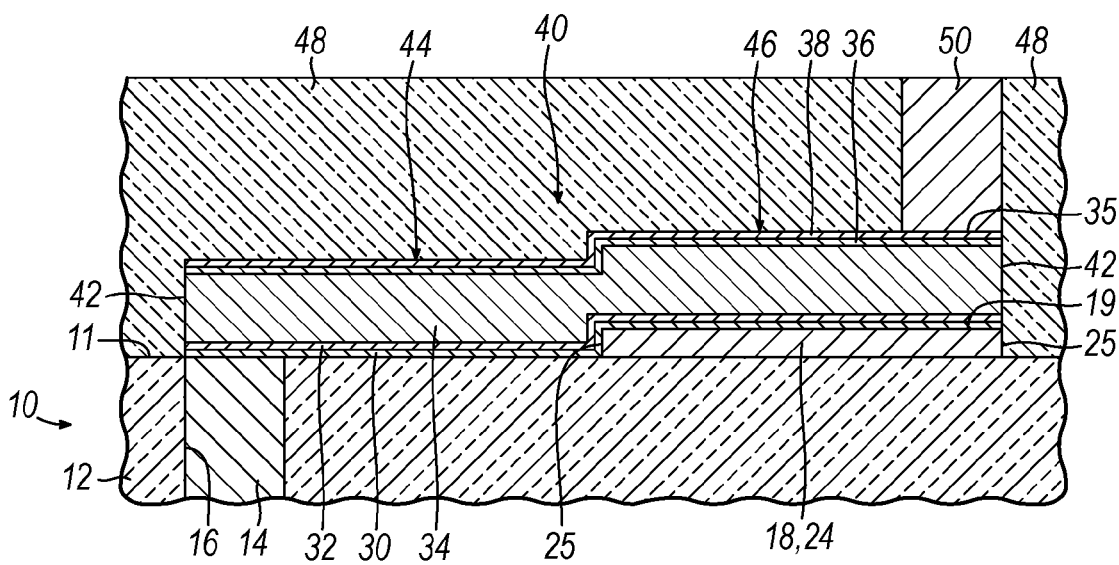

With reference to FIG. 4 in which like reference numerals refer to like features in FIGS. 3A, 3B and at a subsequent fabrication stage, a dielectric layer 48 and one or more contacts 50 are each formed in a respective via that penetrates through the dielectric layer 48. Each contact 50 lands on the top surface 35 of layer 38 to establish a direct electrical and physical contact with the anode 46 of the electrical fuse 40. The dielectric layer 48 and the one or more contacts 50 are respectively similar in construction and materials to the dielectric layer 12 and the contact 14.

Standard wafer processing then resumes, with formation of contact via metallurgy, back-end-of-line (BEOL) wiring, interlevel and intermetal dielectrics, and interconnects.

Figure 5:
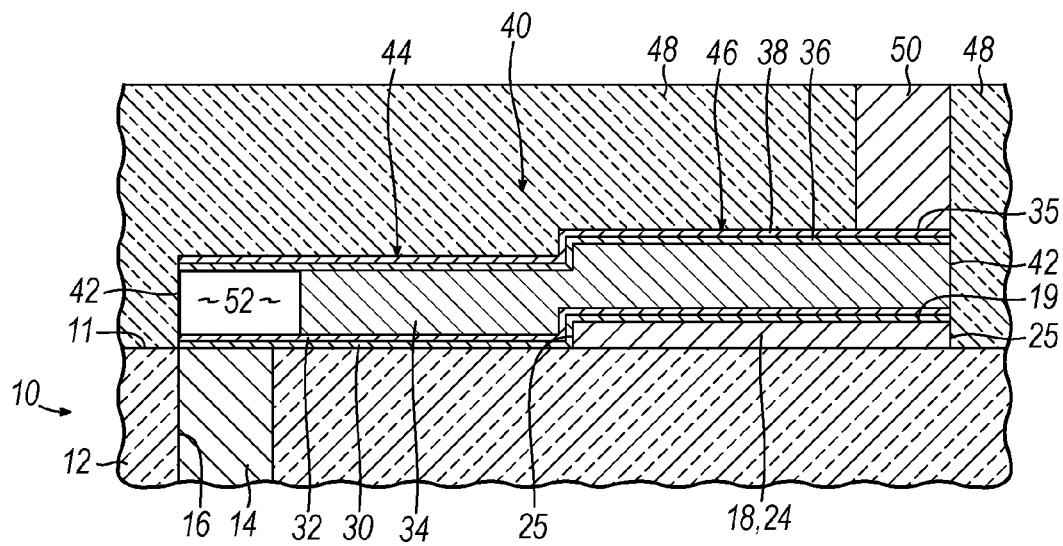
FIGS. 5-7 are cross-sectional views of the electrical fuse of FIG. 4 depicted in a series of different programmed states.
Figure 6:
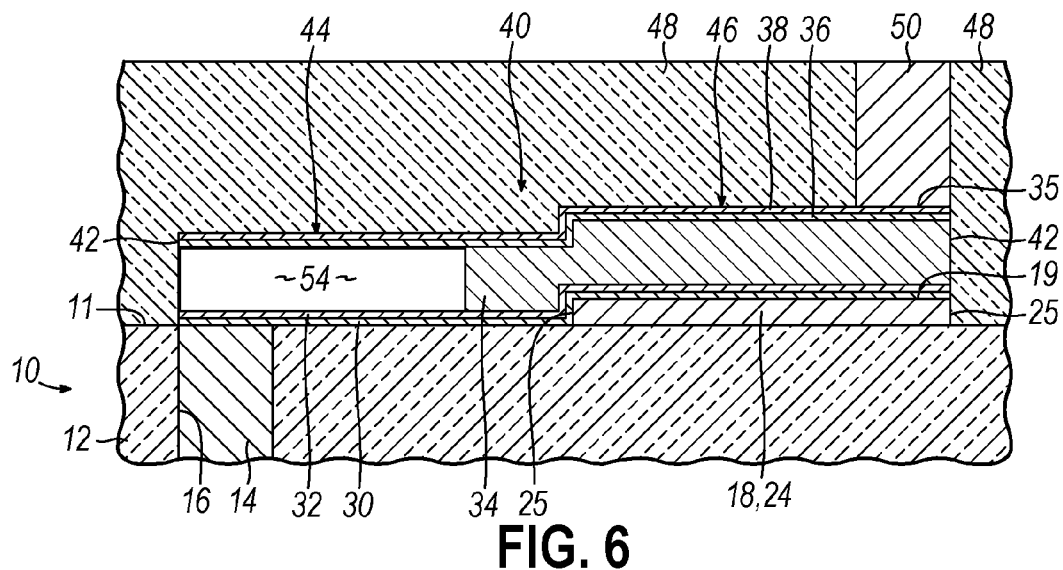
Figure 7:
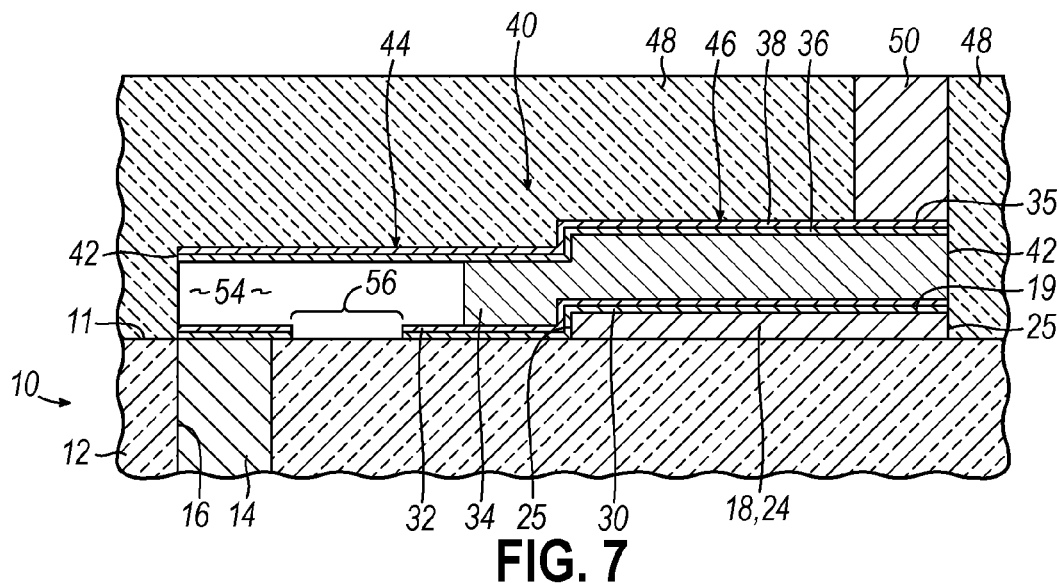

With reference to FIGS. 5-7 in which like reference numerals refer to like features in FIG. 4, the programming of the electrical fuse 40 can occur by electromigration and/or by rupture. The programmed electrical fuse 40 may exhibit a soft blow regime (FIG. 8) that relies on electromigration as a mechanism to alter (i.e., increase) the resistance of the fuse 40 while maintaining a closed electrical circuit for current flow. The soft blown regime is characterized by multiple soft blown states each having a different resistance value. The programmed electrical fuse 40 may also exhibit an open or hard blown state (FIG. 8) that relies on layer rupture as a mechanism to elevate the resistance of the fuse 40. The hard blown state of the programmed electrical fuse 40 is characterized by a relatively large resistance in comparison with the different states in the soft blown regime.

Figure 8:
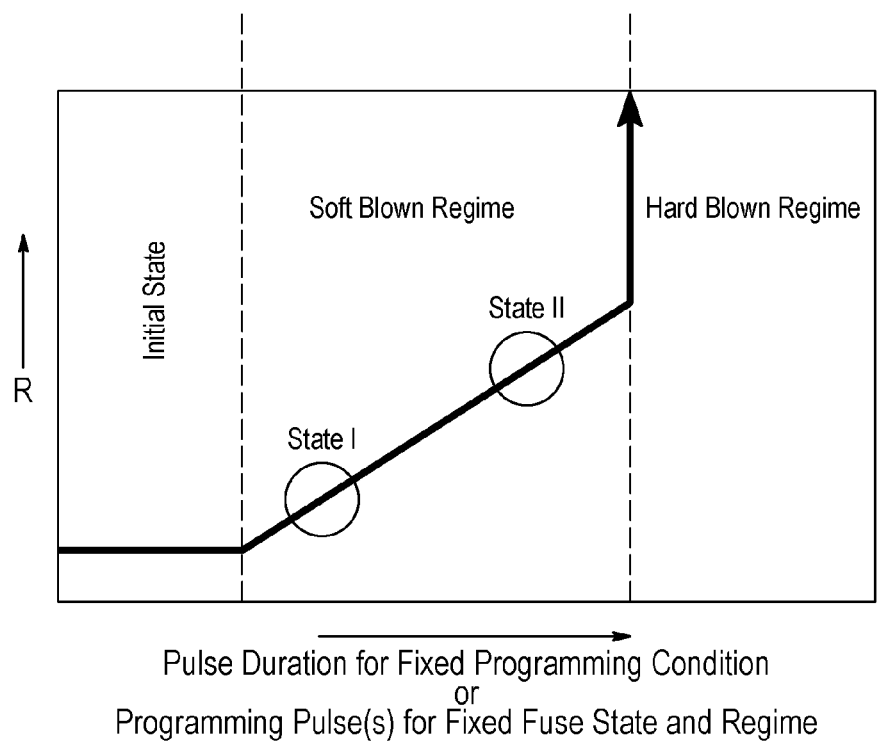
FIG. 8 is a graphical view of the electrical resistance of the electrical fuse in the different programmed states of FIGS. 4-7.

As apparent in FIG. 8, both mechanisms for programming elevate the resistance of the programmed fuse 40 compared to that of the unprogrammed fuse 40. The resistance of the electrical fuse 40 monotonically increases for different soft blown states within the soft blow regime. In the hard blown state, the resistance of the electrical fuse 40 increases abruptly due to the mechanism difference.

Before programming is initiated, the electrical fuse 40 has an initial state as shown in FIG. 4 and an initial value of resistance that is relatively low. The electrical fuse 40 defines a closed circuit path from the cathode represented by contact 14 to the anode 46. The electrical fuse 40 may be connected with programming circuitry, which may consist of one or more transistors (e.g., thick-oxide n-FETs connected in series) designed to draw a large amount of current. The electrical fuse 40 may also be connected with sense circuitry that reads the state of the fuse 40. The sense circuitry can measure the resistance of the electrical fuse 40 to determine whether the electrical fuse 40 has been programmed or is intact. In particular, the sense circuitry can measure an approximate value of the fuse resistance to determine the state of the fuse. One approach to measuring the fuse resistance is to compare the measured fuse resistance with the known resistance of a reference resistor. Control logic directs the fuse program operations of the programming circuitry and the fuse read operations of the sense circuitry. The programming and sensing voltages may be derived from an external voltage source.

During programming of the electrical fuse 40, a bias potential is applied between the anode 46 and the cathode represented by contact 14. The identity of the anode and the cathode may be swapped contingent upon the polarity of the bias potential applied to the electrical fuse 40 during programming The bias potential may be applied in a pulse train or as a single pulse of a lengthier duration. Electrical current of relatively high density flows through the fuse link 44 from the cathode represented by contact 14 to the anode 46. As electrical current flows through the fuse link 44, the temperature of the fuse link 44 is elevated by ohmic heating. The elevated temperature combined with the high current density promotes electromigration of the conductive material of layer 34 in a direction toward the anode 46. The space formerly occupied by the electromigrated material of the fuse link 44 becomes a void that does not carry current. The rate and extent of the electromigration of layer 34 and void size during programming of the electrical fuse 40 is contingent on the temperature developed in the fuse link 44 and the current density flowing through the fuse link 44. The programming may also rupture the layers 32, 34 in a region previously voided by layer 34 to interrupt the electrical continuity of the fuse link 44 and open the electrical fuse 40.

As shown in FIG. 5, the electrical fuse 40 can be placed in a first programmed soft blown state (e.g., state I shown on FIG. 8) determined by a pulse duration or a number of shorter duration pulses. Layer 34, which has a higher electromigration susceptibility than the cladding layers 30, 32 and a lower melting point than the cladding layers 30, 32, electromigrates in a direction away from the cathode at contact 14. Specifically, a void 52 is formed inside of the layer 34 due to atomic movement caused by momentum transfer from the electron flux at a high current density. When the void 52 has increased in size such that the layer 34 no longer overlies contact 14, the programming current is primarily conducted by the cladding layers 30, 32 in the fuse link 44 from the cathode represented by contact 14 to the anode 46. In this first soft blown state, the fuse link 44 has a first resistance that is higher than the initial resistance of FIG. 4.

As shown in FIG. 6, the electrical fuse 40 can be placed in a second programmed soft blown state (e.g., State II shown on FIG. 8) determined by a longer pulse duration or a larger number of shorter duration pulses. A void 54, which is volumetrically larger than void 52, is formed inside of the conductor constituting layer 34 due to atomic movement caused by momentum transfer from the electron flux at a high current density. The programming current is primarily conducted by the cladding layers 30, 32 in the fuse link 44 from the cathode represented by contact 14 to the anode 46. In this second soft blown state, the fuse link 44 has a second resistance that is higher than the first resistance of FIG. 5 due to the larger void volume of missing material.

As shown in FIG. 7, the electrical fuse 40 may be programmed to provide a hard blown state. In particular, a high current pulse or series of high current pulses is applied that causes a rupture 56 in the cladding layers 30, 32 at a location of the void 54 that is free from layer 34 due to past electromigration. The resistance of the electrical fuse 40 in the hard blown state of FIG. 7 may be orders of magnitude greater than the resistance in the initial state (FIG. 4) and in the soft blown states (FIGS. 5, 6). Once programmed to provide the high-resistance hard blown state, the electrical fuse 40 cannot be programmed back to a low-resistance, closed state as the rupture 56 is irreversible.

The anode 46 includes the current shunt 24 subjacent to the layer stack of the anode 46. The current shunt 24 has a relatively low resistance in comparison with the materials in the layer stack comprising layers 30, 32, 34 and provides a low resistance path for current during programming. The current shunt 24 has a higher melting point than the material of layer 34 and will protect the superjacent layers 30, 32, 34 from either melting or electromigrating during programming. The current shunt 24 does not experience electromigration nor melt during programming. The presence of the current shunt 24 makes the electrical fuse 40 more compact by reducing the surface area required for the footprint of the electrical fuse 40.

The material comprising layer 34 exhibits a lower electromigration than the metal silicide layer of conventional electrical fuse constructions. However, the material comprising layer 34 may be unable to handle current densities as high as those handled by silicides, which is mitigated by the introduction of the current shunt 24 into a fuse constructed from CMOS BEOL materials.

The electronic fuse 40 may also be used in applications that include only BEOL passive devices such as inductors, metal-insulator-metal (MIM) capacitors and resistors. These applications lack a silicide level, which prevents the use of a conventional silicided fuse.

Figure 9:
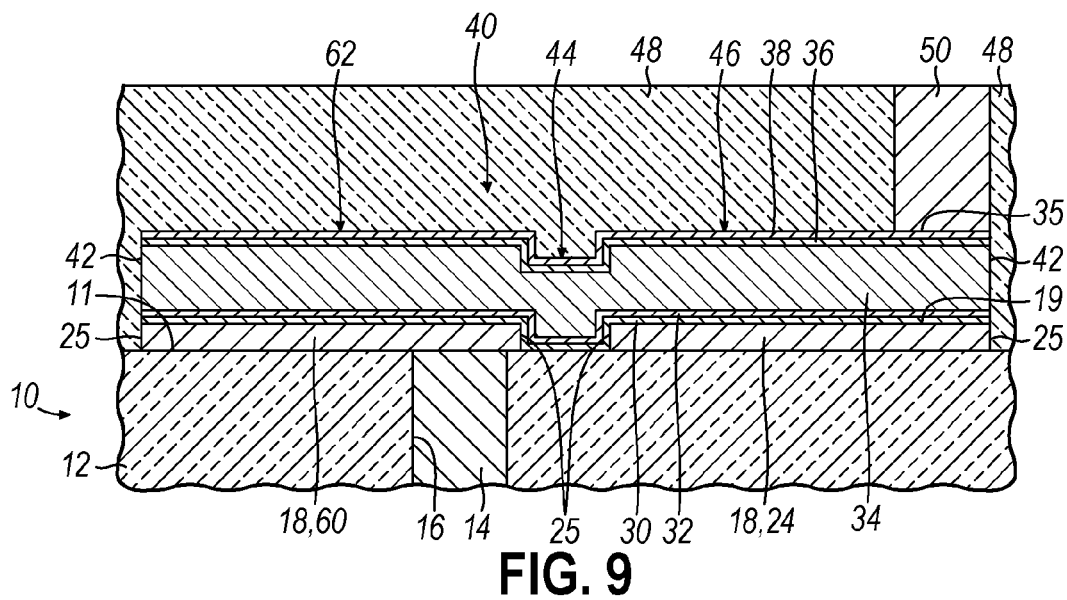
FIGS. 9 and 10 are cross-sectional views similar to FIG. 4 of electrical fuses constructed in accordance with alternative embodiments of the invention.

With reference to FIG. 9 in which like reference numerals refer to like features in FIG. 4 and in accordance with an alternative embodiment, the electrical fuse 40 is modified to have a portion of the cathode represented by features of metallization in the same level as the anode 46. To that end, the pattern in resist layer 20 of FIG. 2 is modified such that another surface area of conductive layer 18 near the contact 14 is masked during the dry etching process 22 and remains as an intact current shunt 60 after the resist layer 20 is stripped. The process flow continues to apply and pattern the layer stack consisting of layers 30, 32, 34, 36, 38, as described above in connection with FIG. 4, with the result that a portion of the patterned layer stack constitutes a portion of cathode 62. The current shunt 60 is located beneath the layer stack of cathode 62 and operates similar to current shunt 24 in that the layer stack overlying the current shunt 60 is resistant to electromigration and melting at the programming current densities.

The fuse link 44 provides a bridge between the anode 46 and cathode 62. In one embodiment, the cathode 62 is a plate with a larger surface area than fuse link 44. In the representative embodiment, the fuse link 44 is a narrow strip of conductive material having narrower cross-sectional area and a smaller surface area than either the anode 46 or the cathode 62. The fuse link 44, anode 46, and cathode 62 are continuous portions of the layer stack in physical and electrical continuity.

In alternative embodiments, one or both of the cladding layers 30, 32 and/or one or both of the cladding layers 36, 38 may be omitted from the fuse construction. In another alternative embodiment, both of the cladding layers 36, 38 may be omitted from the fuse construction while retaining one or both of cladding layers 30, 32.

The fuse link 44 may be shortened in length by the addition of the cathode 62 in the same plane and of the same layer construction as anode 46. The fuse link 44 no longer has a direct electrical and physical contact with the contact 14. The modified version of the electrical fuse 40 is programmable as described above in connection with FIGS. 4-8.

Figure 10:
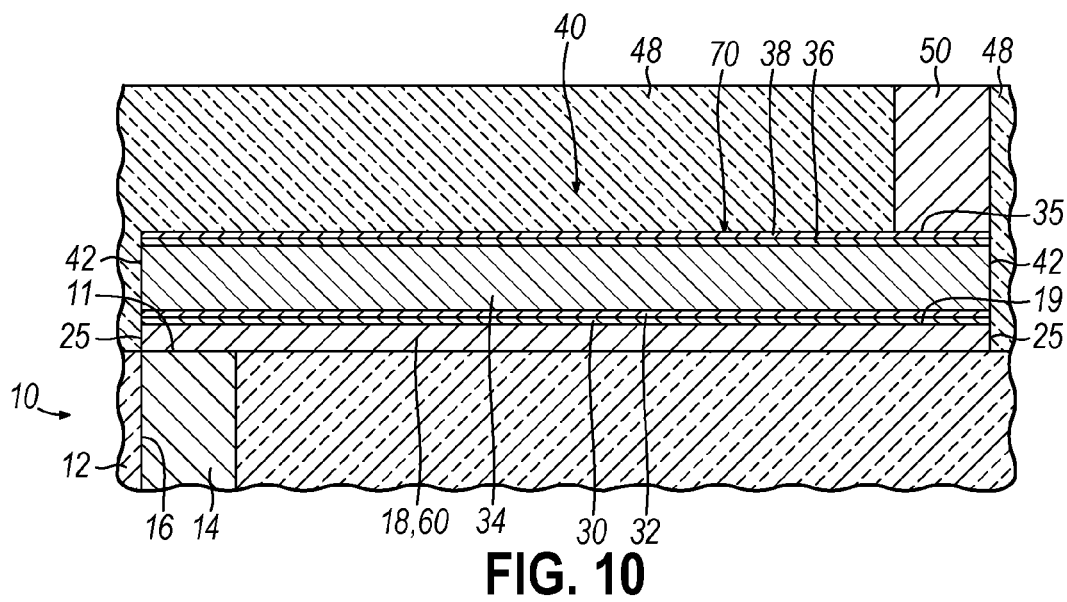

With reference to FIG. 10 in which like reference numerals refer to like features in FIG. 4 and in accordance with an alternative embodiment, the electrical fuse 40 is modified so that the fuse link 70 of the layer stack of layers 30, 32, 34, 36, 38 is entirely underlaid by the current shunt 24. The conductive layer 18 is etched along with the layer stack as described above in connection with FIG. 3 and the portion of the process flow associated with FIG. 2 is omitted. The contact 14 is directly connected with one end of the fuse link 70 and the contact 50 is directly connected with the opposite end of the fuse link 70. The contacts 14, 50 function as cathode and anode of the electrical fuse 40.

The fuse link 70 is programmed using a correlation between resistance and temperature. The programming process may be incremental so that the resistance value gradually approaches a targeted programmed value. As readily apparent to a person having ordinary skill in the art, the fuse link 70 can be programmed to have different resistance values.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming an electrical fuse, the method comprising:
    depositing a first layer comprised of a first conductive material on a top surface of a first dielectric layer;
    patterning the first layer to define a first current shunt;
    depositing a layer stack on the first current shunt and the top surface of the first dielectric layer surrounding the first current shunt, the layer stack including a second layer comprised of a second conductive material and a third layer comprised of a third conductive material; and
    patterning the layer stack to define a fuse link as a first portion of the layer stack directly contacting the top surface of the first dielectric layer and a first terminal as a second portion separated from the top surface of the first dielectric layer by the first current shunt.

2. The method of claim 1 further comprising:
    patterning the first layer to define a second current shunt comprised of the first conductive material; and
    patterning the layer stack to define a second terminal as a third portion of the layer stack separated from the top surface of the first dielectric layer by the second current shunt and connected to the first terminal by the fuse link.

3. The method of claim 2 further comprising:
    forming a contact in the first dielectric layer that is electrically connected with the second current shunt as a second terminal.

4. The method of claim 1 wherein the first conductive material has a higher melting point than the second conductive material and the third conductive material.

5. The method of claim 1 wherein the first terminal has a larger surface area as a footprint on the top surface of the first dielectric layer than the fuse link.

6. The method of claim 1 wherein the layer stack further includes a fourth layer of a fourth conductive material that is separated from the second layer by the third layer so that the second and fourth layers clad the third layer.

7. The method of claim 1 further comprising:
    depositing a second dielectric layer superjacent the layer stack; and
    forming a contact penetrating through the second dielectric layer to land on the first terminal.

8. The method of claim 1 further comprising:
    forming a contact in the first dielectric layer that is directly connected with the fuse link.

9. The method of claim 1 wherein the first conductive material is comprised of titanium, titanium nitride, or a bilayer of titanium and titanium nitride, the second conductive material is comprised of aluminum or copper, and the third conductive material is comprised of tungsten.

10. The method of claim 6 wherein the first conductive material and the fourth conductive material are each comprised of titanium, titanium nitride, or a bilayer of titanium and titanium nitride, the second conductive material is comprised of aluminum or copper, and the third conductive material is comprised of tungsten.

11. The method of claim 4 wherein the first conductive material has a lower electromigration susceptibility than the second conductive material and the third conductive material.

* * * * *